United States Patent
Chiu et al.

(10) Patent No.: US 9,899,526 B2
(45) Date of Patent: Feb. 20, 2018

(54) FIN-TYPE FIELD EFFECT TRANSISTOR STRUCTURE AND MANUFACTURING METHOD THEREOF

(71) Applicant: Taiwan Semiconductor Manufacturing Co., Ltd., Hsinchu (TW)

(72) Inventors: Yi-Wei Chiu, Kaohsiung (TW); Li-Te Hsu, Tainan (TW); Chung-Fan Huang, Hsinchu (TW); Chih-Hsiang Chu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/996,236

(22) Filed: Jan. 15, 2016

(65) Prior Publication Data

US 2017/0207338 A1      Jul. 20, 2017

(51) Int. Cl.
    *H01L 29/78*    (2006.01)
    *H01L 29/66*    (2006.01)

(52) U.S. Cl.
    CPC .... *H01L 29/7853* (2013.01); *H01L 29/66795* (2013.01); *H01L 29/785* (2013.01); *H01L 29/7848* (2013.01)

(58) Field of Classification Search
    CPC ..... H01L 21/823431; H01L 21/823821; H01L 21/845; H01L 27/0886; H01L 27/0924; H01L 27/10826; H01L 27/10879; H01L 27/1211; H01L 29/41791; H01L 29/66795; H01L 29/7831; H01L 29/7853; H01L 29/7848; H01L 29/785
    USPC ........ 257/263, 288, 328, 368, 369; 438/137, 438/151, 156, 192, 197, 199
    See application file for complete search history.

(56) References Cited

U.S. PATENT DOCUMENTS

| | | | |
|---|---|---|---|
| 2013/0309838 A1* | 11/2013 | Wei ................... | H01L 21/76229 438/424 |
| 2015/0214369 A1* | 7/2015 | Fronheiser .......... | H01L 29/0847 257/192 |
| 2015/0228653 A1* | 8/2015 | Cheng ................. | H01L 27/0924 257/369 |
| 2016/0225675 A1* | 8/2016 | Shen ............... | H01L 21/823842 |
| 2016/0260636 A1* | 9/2016 | Lin ................. | H01L 21/823412 |

* cited by examiner

*Primary Examiner* — Shahed Ahmed
(74) *Attorney, Agent, or Firm* — JCIPRNET

(57) ABSTRACT

A fin-type field effect transistor comprising a substrate, fins, insulators, at least one gate stack and strained material portions is described. The insulators are disposed in trenches of the substrate and between the fins. The upper portion of the fin is higher than a top surface of the insulator and the upper portion has a substantially vertical profile, while the lower portion of the fin is lower than the top surface of the insulator and the lower portion has a tapered profile. The at least one gate stack is disposed over the fins and on the insulators. The strained material portions are disposed on two opposite sides of the at least one gate stack.

14 Claims, 8 Drawing Sheets

FIN-TYPE FIELD EFFECT TRANSISTOR STRUCTURE AND MANUFACTURING METHOD THEREOF

BACKGROUND

Three-dimensional multi-gate structures, such as the fin-type field effect transistor (FinFET), have been developed to replace planar CMOS devices. One of the structural features of the FinFET is the semiconductor fins extending vertically from the substrate surface, and the gate wrapping around the fin(s) further provides improved electrical control over the channel.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
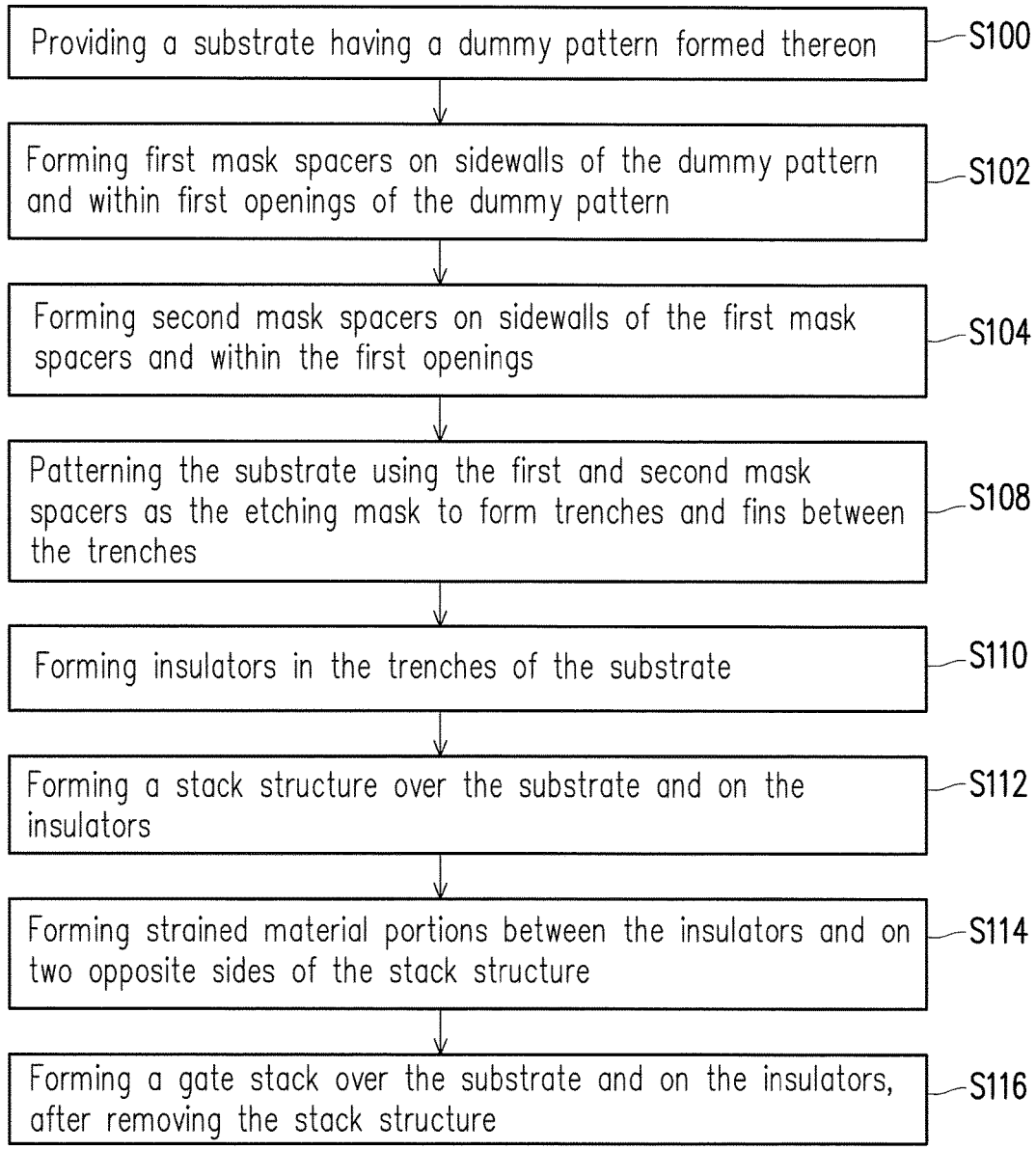
FIG. 1 is an exemplary flow chart showing the process steps of the manufacturing method for forming a FinFET in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The embodiments of the present disclosure describe the exemplary manufacturing processes of FinFETs and the FinFETs fabricated there-from. The FinFET may be formed on bulk silicon substrates in certain embodiments of the present disclosure. Nevertheless, the FinFET may be formed on a silicon-on-insulator (SOI) substrate or a germanium-on-insulator (GOI) substrate as alternatives. Also, in accordance with the embodiments, the silicon substrate may include other conductive layers or other semiconductor elements, such as transistors, diodes or the like. The embodiments are intended for illustration purposes but not intended to limit the scope of the present disclosure.

In accordance with the embodiments, FIG. 1 is an exemplary flow chart showing some of the process steps of the manufacturing method for forming a FinFET. The various process steps illustrated in FIG. 1 may further comprise multiple process steps as described below.

Although the steps of the method are illustrated and described as a series of acts or events, it will be appreciated that the illustrated ordering of such acts or events are not to be interpreted in a limiting sense. In addition, not all illustrated process or steps are required to implement one or more embodiments of the present disclosure.

Referring to FIG. 1, in Step 100, a substrate having a dummy pattern formed thereon is provided. In one embodiment, the dummy pattern comprises first openings. In step 102, first mask spacers are formed on sidewalls of the dummy pattern and within the first openings. In Step 104, second mask spacers are formed on sidewalls of the first mask spacers and within the first openings. In one embodiment, one first mask spacer and one second mask spacer located on the sidewall of the first mask spacer constitute one double mask spacer. In Step 106, the dummy pattern is removed to form second openings. In certain embodiments, a dimension of the first openings substantially equals to a dimension of the second opening. That is, the spacing of the double mask spacers is substantially equal. In Step 108, the substrate is patterning using the first and second mask spacers as the etching mask to form trenches and fins between the trenches. In Step 110, insulators are formed in the trenches of the substrate. In Step 112, a stack structure is formed over the substrate and on the insulators, and the stack structure covers portions of the fins. In Step 114, strained material portions are formed between the insulators and on two opposite sides of the stack structure. In Step 116, a gate stack is formed over the substrate and on the insulators, after removing the stack structure. The strained material portions are located on two opposite sides of the gate stack.

FIGS. 2A-2L are the cross-sectional views and perspective views showing the FinFET at various stages of the manufacturing method for forming the FinFET according to some embodiments of the present disclosure.

It is to be noted that the process steps described herein cover a portion of the processes used to fabricate a FinFET device.

Figure 2A:
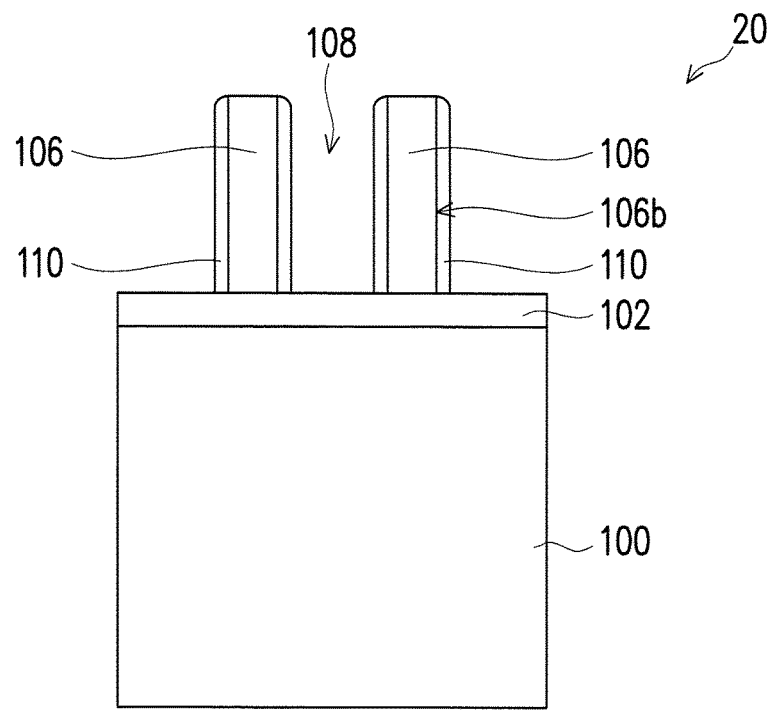
FIGS. 2A-2L are the cross-sectional views and perspective views showing the FinFET at various stages of the manufacturing method for forming a FinFET according to some embodiments of the present disclosure.

As shown in FIG. 2A, a substrate 100 is provided. In some embodiments, the substrate 100 is a bulk silicon substrate having a pad layer 102 formed over the substrate 100. Depending on the requirements of design, the bulk silicon substrate is a p-type substrate or an n-type substrate and comprise different doped regions configured for an n-type FinFET or a p-type FinFET. In certain embodiments, the pad layer 102 is formed optionally and includes a pad oxide layer or a protective layer. In one embodiment, the pad oxide layer is a native oxide layer formed by, for example, thermal oxidation. Then, in some embodiments, a dummy pattern 106 having openings 108 is formed on the pad layer 102 and over the substrate 100. In one embodiment, the material of the dummy pattern 106 includes polysilicon. In one embodiment, the dummy pattern 106 is formed by depositing a polysilicon layer (not shown) and then patterning the polysilicon layer. In certain embodiments, after forming the dummy patter 106, first mask spacers 110 are formed on sidewalls 106*b* of the dummy pattern 106. The first mask spacers 110 are located on and cover the sidewalls 106*b* of the dummy pattern 106, including the sidewalls 106*b* of the dummy pattern 106 within the openings 108. In one embodiment, the first mask spacers 110 are formed by depositing a conformal first mask layer (not shown) over the substrate 100 and over the dummy pattern 106, and then etching back the first mask layer to form the first mask spacers 110 on the sidewalls 106*b* of the dummy pattern 106. The formation of the first mask spacers 110 includes forming the first mask layer by, for example, chemical vapor deposition (CVD) or atomic layer deposition (ALD) and the etching of the first mask layer includes at least one anisotropic etching process or isotropic etching process. In one embodiment, the material of the first mask spacers 110 includes silicon nitride or silicon oxide. In certain embodiments, at least one anisotropic (dry) etching process is used to etch back the first mask layer and the etch selectivity for the first mask layer 111 to the dummy pattern 106 is high.

Figure 2B:
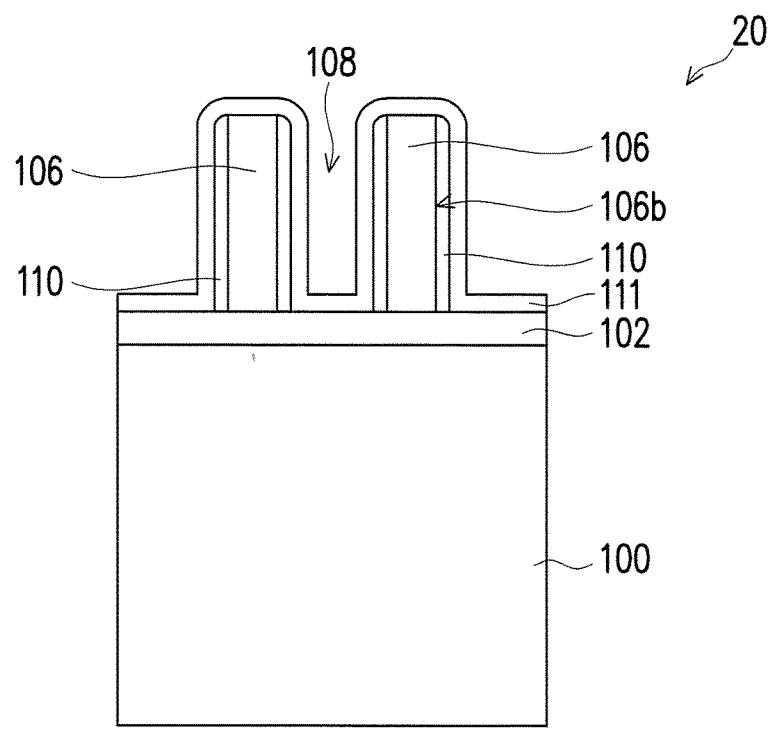

In FIG. 2B, in some embodiments, a second mask layer 111 is formed over the substrate 100 and on the first mask spacers 110 and the dummy pattern 106, and the second mask layer 111 conformally covers the first mask spacers 110 and the dummy pattern 106 (i.e. conformal to the profile of the dummy pattern 110). In one embodiment, the material of the second mask layer 111 includes silicon oxide or silicon nitride. In some embodiments, the second mask layer 111 is formed by, for example, CVD or ALD.

Figure 2C:
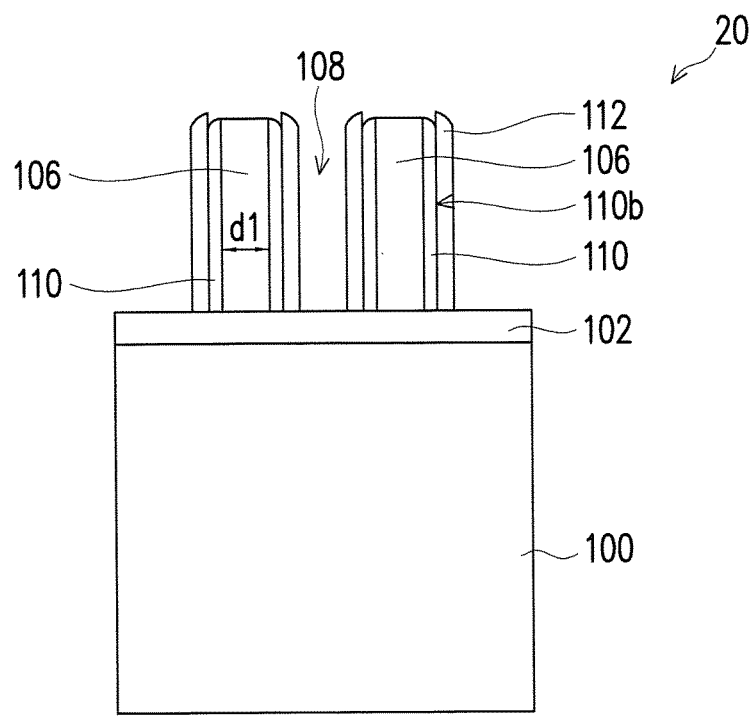

Referring to FIG. 2C, in some embodiments, second mask spacers 112 are formed on the sidewalls 110*b* of the first mask spacers 110 by etching back the second mask layer 111 to expose the dummy pattern 106 and the pad layer 102. The second mask spacers 112 are located on and cover the sidewalls 110*b* of the first mask spacers 110, including the sidewalls 110*b* of the first mask spacers 110 within the openings 108. In certain embodiments, the etching back of the second mask layer 111 includes at least one includes at least one anisotropic etching process or isotropic etching process. Depending on the recipe and conditions of the etching process, the materials of the first mask spacers 110 and the second mask layer 111 are chosen to have suitable etching selectivity. In some embodiments, at least one anisotropic (dry) etching process is used to etch the second mask layer 111 and the dry etch selectivity for the second mask layer 111 is high. In one embodiment, the etch selectivity of the second mask layer to the first mask layer or the dummy pattern is more than 1:1 and can be 50:1 or higher. In one embodiment, the material of the first mask spacers 110 is silicon nitride, while the material of the second mask spacers 112 is silicon oxide. In one embodiment, the material of the first mask spacers 110 is silicon oxide, while the material of the second mask spacers 112 is silicon nitride. One first mask spacer 110 and the corresponding second mask spacer 112 located thereon are considered as one double mask spacer 115. The double mask spacers 115 located on the sidewalls of the dummy pattern 106 further narrow down the dimension(s) of the openings 108. The tolerance for the linewidth or the critical dimension of the dummy pattern and process windows for forming the dummy pattern can be improved as the additional double mask spacers 115 are formed on the sidewalls of the dummy pattern.

Figure 2D:
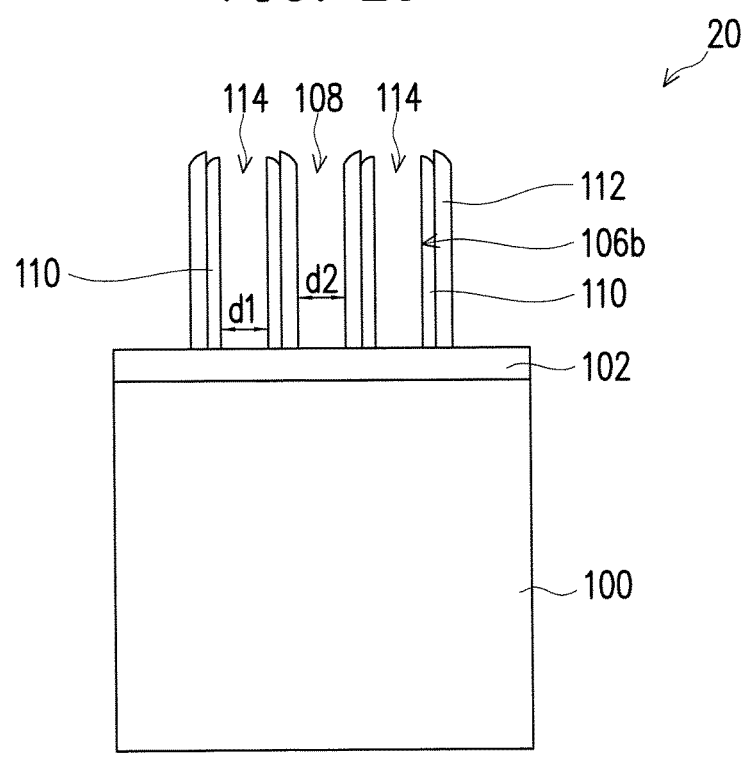

In FIG. 2D, the dummy pattern 106 sandwiched between the first mask spacers 110 is removed to form openings 114 between the first mask spacers 110. In some embodiments, the linewidth of the dummy pattern 106, the pitch of the dummy pattern 106, the thickness of the first mask spacers 110 and the thickness of the second mask spacers 112 are carefully tuned and chosen so that the width d1 of the openings 114 (i.e. the linewidth of the dummy pattern 106) and the width d2 of the remained openings 108 are substantially equivalent or the same. That is, the distance between the double mask spacers (functioning as the mask pattern) is the same or the spacing of the mask pattern is substantially identical.

Figure 2E:
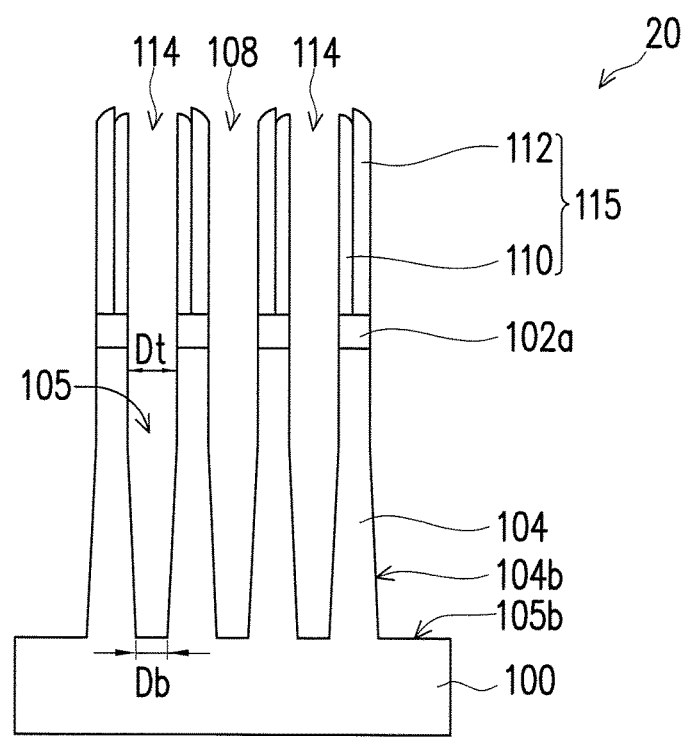

In FIG. 2E, the substrate 100 is patterned to form trenches 105 in the substrate 100 and the fins 104 are formed between the trenches 105 by etching into the substrate 100, using the first mask spacers 110 and the second mask spacers 112 as etching masks. In one embodiment, the patterning of the substrate includes performing one or more anisotropic etching processes, reactive ion etching processes or combinations thereof. In some embodiments, the trenches 105 are strip-shaped and arranged in parallel and two adjacent trenches 105 are spaced apart by one fin 104. By tuning the etching conditions of the etching process for patterning the substrate 100, the resultant trench 105 has an upper part with a substantially vertical side profile and a lower part with a tapered side profile, so that the top dimension Dt of the trench 105 is larger than the bottom dimension Db of the resultant trench 105. The depth of the trenches 105 is adjustable depending on the process needs. In FIG. 2E, four fins 104 are shown and the fins 104 are active fins, but other kinds of fins, such as cut fins or dummy fins may be included within the structure to meet the process requirements and the number of the fins is not limited by the embodiments described herein.

In FIG. 2E, as the spacing of the mask dimension is constant (the width d1 of the openings 114 substantially equivalent to the width d2 of the remained openings 108), the resultant fins 104 are largely uniform and consistent with a substantially equal spacing, thus avoiding the even/odd issues or fin bending issues and improving the yield of the device. In some embodiments, the fins 104 standing upright from the substrate 100 have a tapered profile (i.e. the angle between the sidewall 104*b* of the fin 104 and the bottom surface 105*b* of the trench 105 being larger than 90 degrees). This can be attributed to the etching conditions adjusted for forming high aspect ratio structures or structures with small pitches. In some embodiments, the height of the fins 104 (i.e. the depth of the trench 105) ranges from about 5 nm to about 500 nm, while the spacing (or pitch) of the fins 104 ranges from about 5 nm to about 150 nm. In certain embodiments, as the width d1 of the opening 114 and the width d2 of the opening 108 are substantially equivalent, the resultant trenches 105 have a substantially equal dimension. That is, two most adjacent fins 104 are spaced apart with a substantial equal spacing (pitch).

The above-described processes for forming the double mask spacers may also be used to form one or more mask patterns for forming, metal lines, interconnection or other patterns with tight pitch or small spacing in the semiconductor manufacturing processes. The formation of the double mask spacers is not limited to be used for forming the fins as described in the embodiments herein.

Figure 2F:
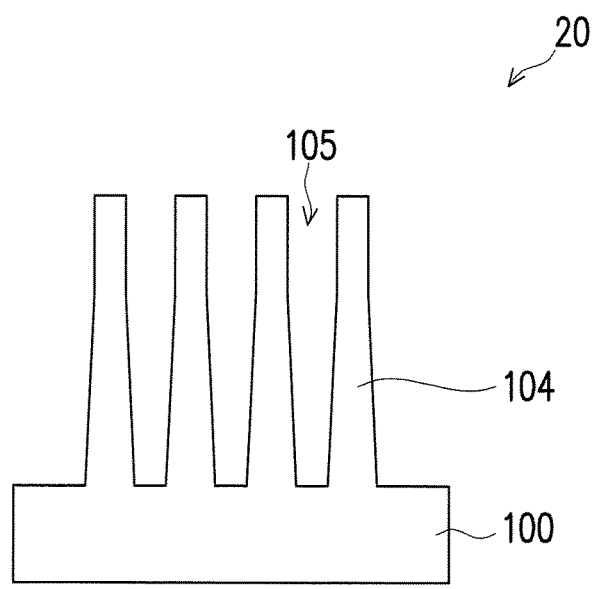

In FIG. 2F, in certain embodiments, the remained first and second mask spacers 110, 112 are removed after the trenches 105 and the fins 104 are formed. In one embodiment, the removal of the first and second mask spacers includes performing at least one anisotropic or isotropic etching process. In one embodiment, a cleaning process is optionally performed to remove the remained pad layer 102a using diluted hydrofluoric acid or other suitable cleaning solutions.

Figure 2G:
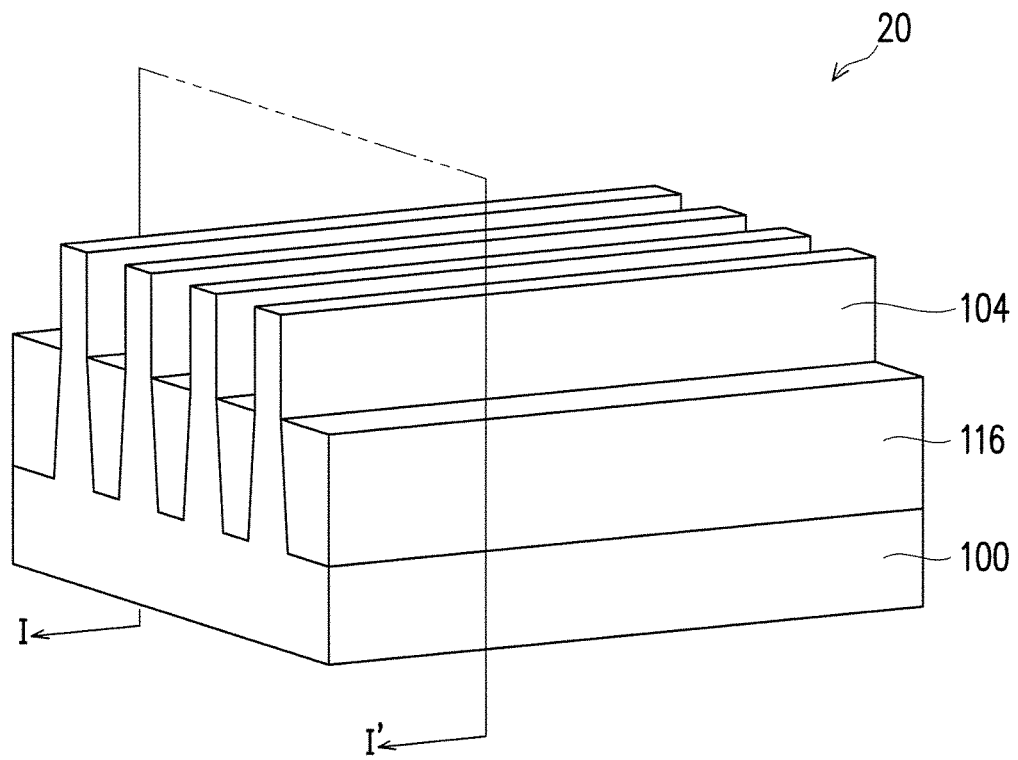
Figure 2H:
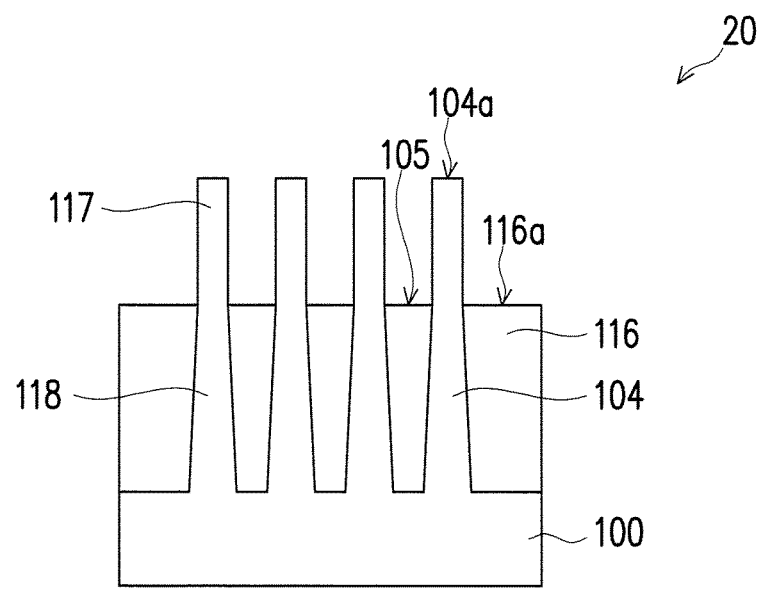

FIG. 2G is a perspective view of the FinFET 20 at one of various stages of the manufacturing method, and FIG. 2H is a cross-sectional view of the FinFET 20 taken along the line I-I' of FIG. 2G. As shown in FIG. 2G & FIG. 2H, insulators 116 filled within the trenches 105 are formed. In some embodiments, an insulating material (not shown) is formed over the substrate 100 and the fins 104 and filling the trenches 105. The insulating material includes silicon oxide, silicon nitride, silicon oxynitride, a spin-on dielectric material, or a low-k dielectric material. The insulating material is formed by high-density-plasma chemical vapor deposition (HDP-CVD), sub-atmospheric CVD (SACVD) or by spin-on. Optionally, a chemical mechanical polish process is performed to remove the insulating material above the fins 104. In one embodiment, the insulating material filled in the trenches 105 between the fins 104 is partially removed by an etching process, and the insulating material remained within the trenches 105 becomes insulators 116 with top surfaces 116a lower than the top surfaces 104a of the fins 104. In some embodiments, upper portions 117 of the fins 104 protrude from the top surfaces 116a of the insulators 116 and lower portions 118 of the fins 104 that are lower than the top surfaces 116a of the insulators 116 are covered by the insulators 116. That is, the lower portions 118 are sandwiched by the insulators 116 and covered by the insulators 116, while the upper portions 117 are not covered by the insulators 116. The height of the insulators 116 may be determined depending on the requirements of the design. In one embodiment, the etching process for partially removing the insulating material is performed by using a wet etching process with hydrofluoric acid (HF). In another embodiment, the etching process is performed by using a dry etching process.

Figure 2I:
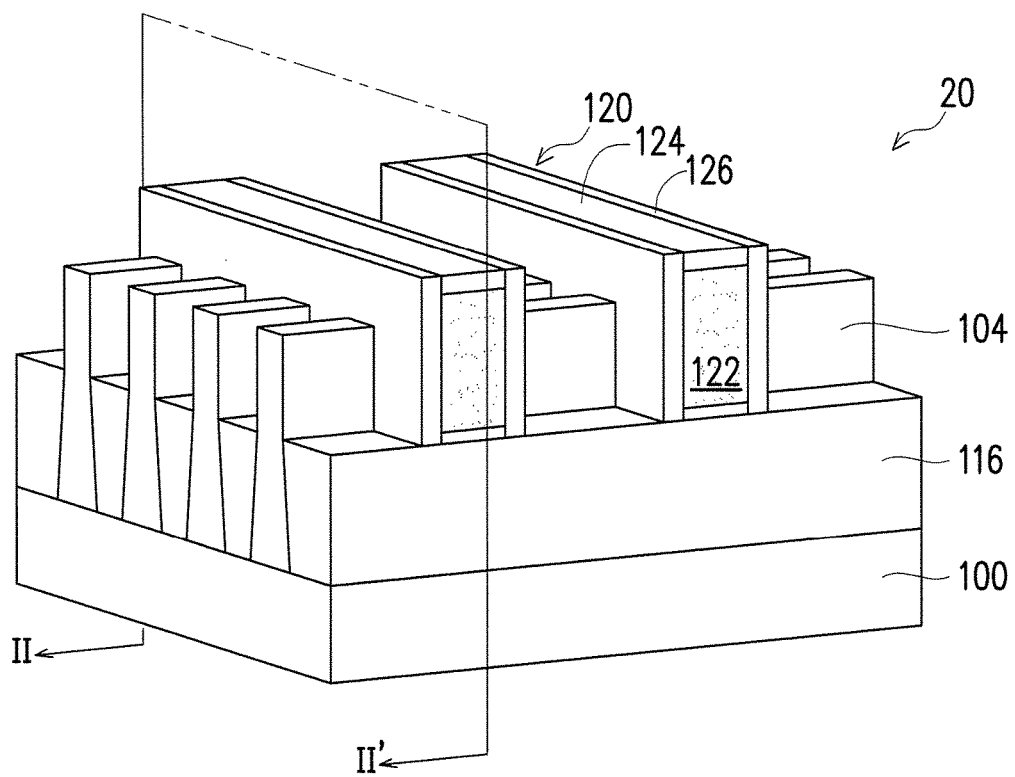
Figure 2J:
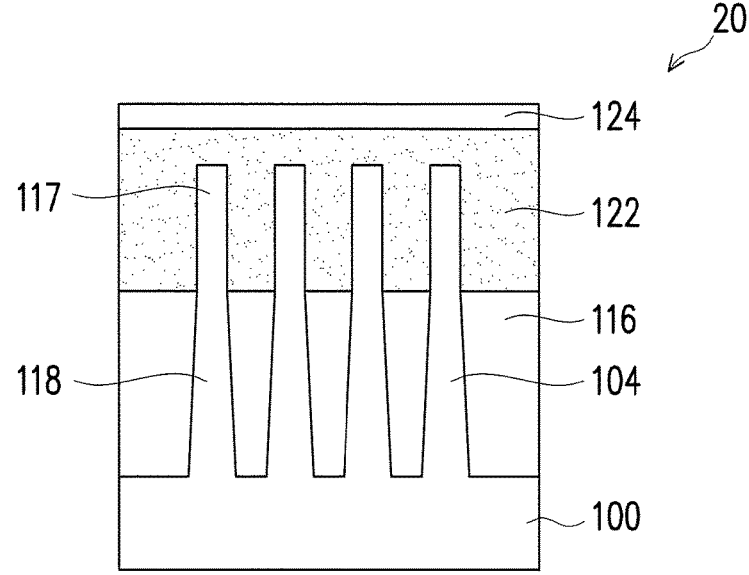

FIG. 2I is a perspective view of the FinFET 20 at one of various stages of the manufacturing method, and FIG. 2J is a cross-sectional view of the FinFET 20 taken along the line I-I' of FIG. 2I. As shown in FIG. 2I & FIG. 2J, a stack structure 120 is formed over the substrate 100 and on the insulators 116, and across and over the upper portions 117 of the fins 104. In FIG. 2I, two stack structures are shown, and the number of the stack structures 120 are for illustrative purposes but not intended to limit the structure of the present disclosure. In some embodiments, as shown in FIG. 2I, the stack structures 120 are arranged in parallel. The extending direction of the stack structure 120 is perpendicular to the extending direction of the fin 104. In certain embodiments, the stack structure 120 comprises a polysilicon strip 122 and a hard mask strip 124 located on the polysilicon strip 122. Spacers 126 are located on sidewalls of the polysilicon strip 122 and the hard mask strip 124. In one embodiment, the stack structure 120 covers the upper portions 117 of the fins 104. In some embodiments, the stack structure 120 is formed by depositing a polysilicon layer (not shown), a hard mask layer (not shown) over the polysilicon layer and then patterning the hard mask layer and the polysilicon layer to form the polysilicon strips 122 and the hard mask strips 124. Optionally, an oxide layer (not shown) is formed before forming the polysilicon layer to protect the fins 116. Then, the spacers 126 are formed on the sidewalls of the hard mask strip 124 and the polysilicon strip 122. In one embodiment, the hard mask strip 124 is formed of silicon nitride, silicon oxide or the combination thereof, for example. In some embodiments, the spacers 126 are formed of dielectric materials, such as silicon nitride, SiCON or the combination thereof. The spacers 126 may be a single layer or a multi-layered structure.

Figure 2K:
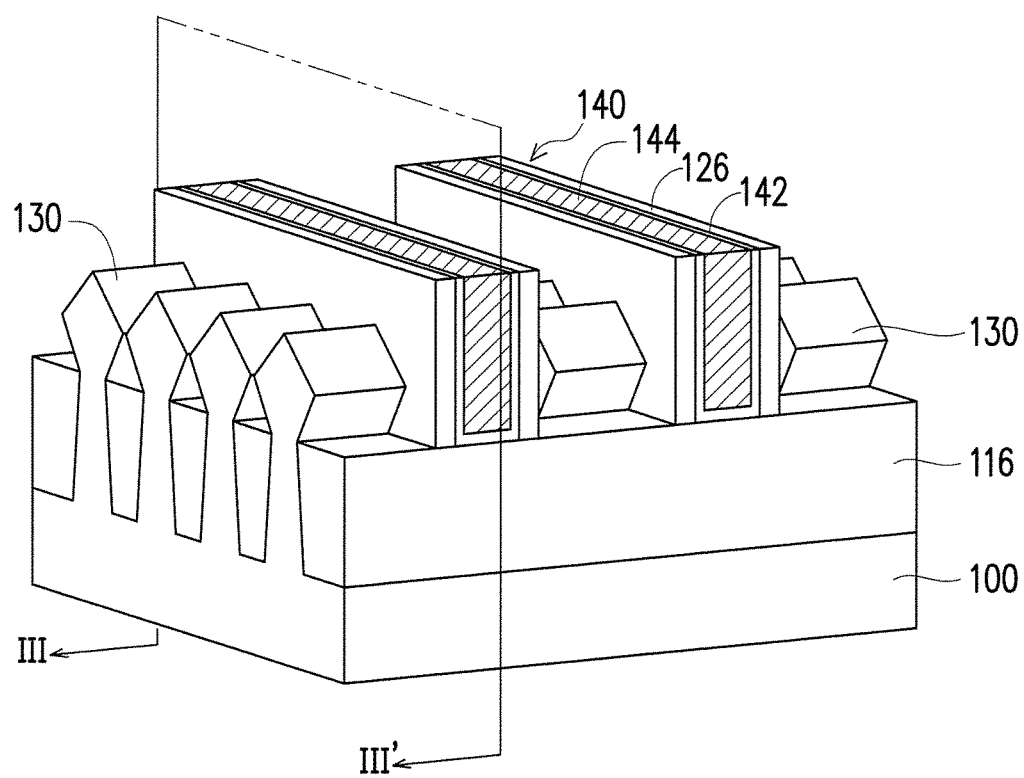
Figure 2L:
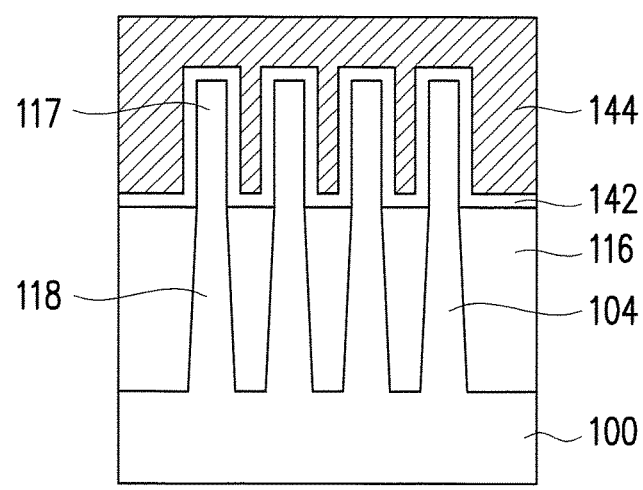

FIG. 2K is a perspective view of the FinFET 20 at one of various stages of the manufacturing method, and FIG. 2L is a cross-sectional view of the FinFET 20 taken along the line I-I' of FIG. 2K. As shown in FIGS. 2K and 2L, in some embodiments, strained material portions 130 are formed between the insulators 116 and on both sides of the stack structure(s) 120 (FIG. 2I). In some embodiments, the material of the strained material portions 130 comprise silicon germanium (SiGe), silicon carbon (SiC) or silicon phosphide (SiP), for example. In some embodiments, the strained material portions 130 are formed by selectively growing epitaxy. The strained material portions 130 function as source and drain regions. In certain embodiments, the strained material portions 130, also called strained source and drain regions, are located on opposite sides of the stack structure 120. In one embodiment, the strained source and drain regions 130 are optionally formed with silicide top layers (not shown) by silicidation. Then, in some embodiments, the gate stacks 140 are formed, after removing the stack structures 120. In one embodiment, after removing the polysilicon strips 122 and the hard mask strips 124 located on the polysilicon strips 122 between the spacers 126, a gate dielectric layer 142 and a gate electrode layer 144 are sequentially formed within the recesses between the spacers 126. As shown in FIG. 2L, the gate electrode layer 144 and the gate dielectric layer 142 covers the upper portions 117 of the fins 104, and the upper portions 117 function as the channel regions. In some embodiments, the material of the gate dielectric layer 142 comprises silicon oxide, silicon nitride or the combination thereof. In some embodiments, the gate dielectric layer 142 comprises a high-k dielectric material, and the high-k dielectric material has a k value greater than about 7.0 and includes a metal oxide or a silicate of Hf, Al, Zr, La, Mg, Ba, Ti, Pb and combinations thereof. In some embodiments, the gate dielectric layer 142 is formed by ALD, molecular beam deposition (MBD), physical vapor deposition (PVD) or thermal oxidation. In some embodiments, the gate electrode layer 144 comprises a metal-containing material, such as Al, Cu, W, Co, Ti, Ta, Ru, TiN, TiAl, TiAlN, TaN, TaC, NiSi, CoSi or a combination thereof. Depending on whether the FinFET 20 is a p-type FinFET or an n-type FinFET, the materials of the gate dielectric layer 142 and/or the gate electrode layer 144 are chosen. Optionally, a chemical mechanical polishing (CMP) process is performed to remove the excess portions of gate dielectric layer 142 and the gate electrode layer 144. The spacers 126 are located on side walls of the gate dielectric layer 142 and the gate electrode layer 144. That is, the stack structures 120 are replaced and the replacement gate stacks 140 are formed. In some embodiments described herein, the gate stacks 140 are replacement gates, but the gate stack structures or the fabrication processes thereof are not limited by these embodiments.

In FIG. 2K and FIG. 2L, in some embodiments, the gate stacks 140 are located on the insulators 116 and the strained material portions 130 (source and drain regions) are located on two opposite sides of the gate stacks 140 and between the insulators 116. The gate stacks 140 cover the channel regions (upper portions 117) of the fins 104, and the resultant FinFET 20 includes a plurality of fins 104.

Figure 3:
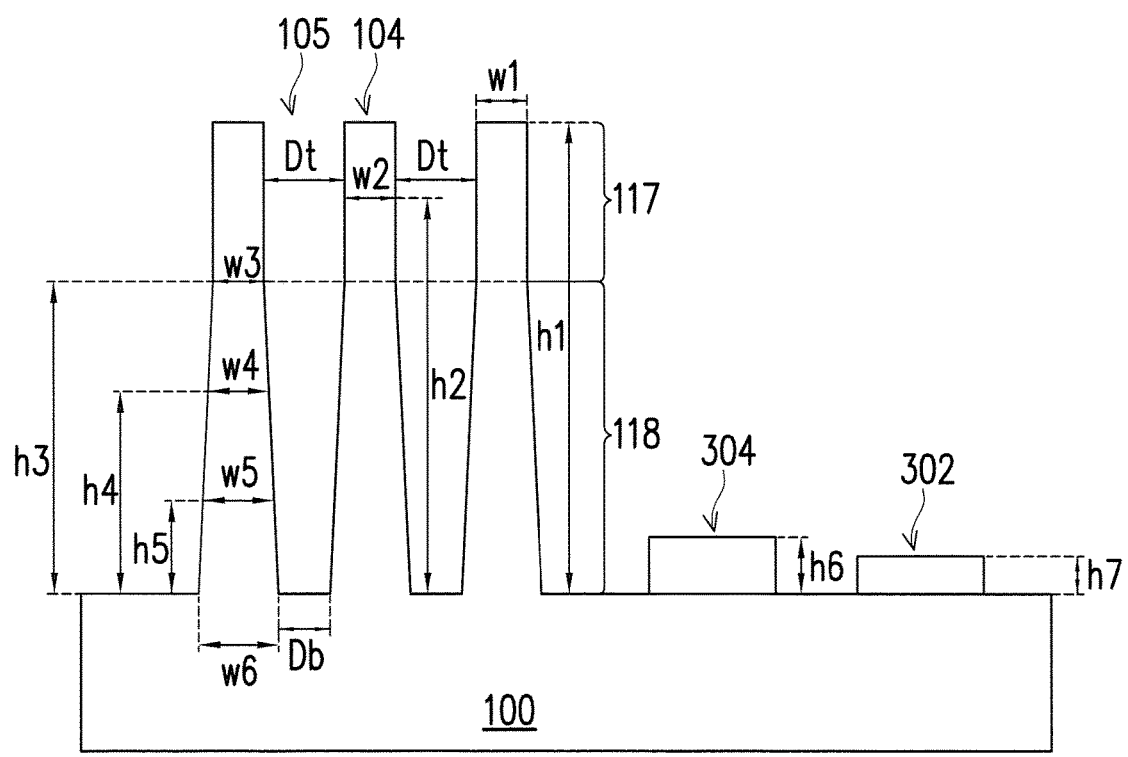
FIG. 3 illustrates an exemplary cross-sectional view of a portion of the fins for a FinFET device according to some embodiments of the present disclosure.

FIG. 3 illustrates an exemplary cross-sectional view of a portion of the fins 104 for a FinFET device according to some embodiments of the present disclosure. In some embodiments, the fin 104 has a tapered profile and the tapered fin 104 has a height h1 counting from the bottom of the trench 105. The tapered profile of the fin 104 includes the upper portion 117 not covered by the insulator 116 and the lower portion 118 covered by the insulator 116. The upper portion 117 of the fin 104 has a substantially vertical profile, while the lower portion 118 of the fin 104 has a tapered profile. As shown in FIG. 3, for the fin 104 at the height h1 (at the topmost point), h2 (at half of the upper portion), h3 (at the separating point of the upper and lower portions), h4 (at 2/3 of the lower portion), h5 (at third of the lower portion) and at the bottom (at the lowest point), the fin 104 has the width w1, w2, w3, w4, w5 and w6 respectively. In certain embodiments, the fin widths w1, w2, w3 are substantially equivalent, and the fin width w6 is about two times of the fin width w3. In certain embodiments, using the fin height of 120 nm as an example, when the heights h1, h2, h3, h4, h5 are 120 nm, 100 nm, 70 nm, 50 nm, 20 nm, the width ranges for the width w1, w2, w3, w4 and w5 are respectively 21-24 nm, 21-24 nm, 21-24 nm, 20-25 nm, 25-30 nm as well as the width range w6 of the fin 104 at the lowest point is 40-50 nm. In one embodiment, the ratio of the fin widths w1:w3: w6 may be about 1:1:2. In certain embodiment, some fins at non-central positions or peripheral locations are cut as dummy fins for avoiding loading effects. In FIG. 3, the dummy fins 302, 304 having heights h7 and h6 are located beside the fins 104. In certain embodiments, if considering the dummy fin 302 of the height h7 as the reference, the height h1 of the fins 104 is about 20 times of the height h7 and the height h6 of the cut dummy fin 304 is about 1.5 times to 4 times of the height h7. The trench 105 has an upper part with a substantially vertical side profile and a lower part with a tapered side profile, so that the top dimension Dt of the trench 105 is larger than the bottom dimension Db of the resultant trench 105. As the fins 104 are defined by the formation of the trenches 105, the dimension(s) of the trenches 105 is the spacing between the fins 104, and the spacing between the fins 104 is substantially identical by using the mask pattern with a constant spacing.

In the above embodiments, the first and second mask spacers (double mask spacers) located on the sidewalls of the dummy pattern narrow down the spacing and adjust the linewidth and pitch of the pattern so as to obtain the pattern with a controlled and uniform spacing (or pitch). During the patterning of the substrate, the etching and the profile of the trenches can be accurately controlled by using the mask pattern with an unvarying spacing (or pitch) as the etching mask. Accordingly, the profiles of the fins, the critical dimension of the fins and the spacing between the fins (fin pitch) are well controlled. The manufacturing methods described in the present disclosure are suitable for the region formed with dense fins (fins arranged with tight spacing), and the height, the profile and spacing of the fins can be tightly controlled.

In the above embodiments, as the etching depth and the profile of the trenches are accurately controlled, the resultant fins have consistent profiles with a substantially equal spacing, thus leading to uniform electrical performance of the device.

In some embodiments of the present disclosure, a fin-type field effect transistor comprising a substrate, insulators, at least one gate stack and strained material portions is described. The substrate has trenches and fins between the trenches. The insulators are disposed in the trenches of the substrate and between the fins. The at least one gate stack is disposed over the fins and disposed on the insulators. The fin comprises an upper portion and a lower portion. The upper portion of the fin is higher than a top surface of the insulator and the upper portion has a substantially vertical profile, while the lower portion of the fin is lower than the top surface of the insulator and the lower portion has a tapered profile. The strained material portions are disposed on two opposite sides of the at least one gate stack.

In some embodiments of the present disclosure, a fin-type field effect transistor comprising a substrate, insulators, at least one gate stack and strained material portions is described. The substrate has trenches and fins between the trenches. The insulators are disposed in the trenches of the substrate and between the fins. The at least one gate stack is disposed over the fins and disposed on the insulators. Lower portions of the fins lower than the top surfaces of the insulators are sandwiched between the insulators and the lower portions have tapered profiles. Upper portions of the fins higher than the top surfaces of the insulators are covered by the at least one gate stack, and the upper portions have substantially vertical profiles. The strained material portions are disposed on two opposite sides of the at least one gate stack.

In some embodiments of the present disclosure, a method for forming a fin-type field effect transistor is described. A substrate having a dummy pattern with first openings is provided. Double mask spacers are formed on sidewalls of the dummy pattern and within the first openings. The dummy pattern is removed to form second openings. A width of the first opening is substantially equivalent to a width of the second opening. The substrate is then patterned to form trenches in the substrate and fins between the trenches by using the double mask spacers as an etching mask. Insulators are formed in the trenches of the substrate. A stack structure is formed over the substrate and on the insulators, wherein the stack structure covers portions of the fins and over the substrate. Strained material portions are formed between the insulators and on two opposite sides of the stack structure. After removing the stack structure, a gate stack is formed over the substrate and on the insulators, and the strained material portions are located on two opposite sides of the gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin-type field effect transistor, comprising:
   a substrate having trenches and fins between the trenches, wherein the fin comprises an upper portion and a lower portion;
   at least one first dummy fin located further away from the fins and at least one second dummy fin located nearer to the fins, wherein a height of the at least one second dummy fin is about 1.5 times to 4 times of a height of the at least one first dummy fin, and a height of the fins is about 20 times of the height of the at least one first dummy fin;
   insulators, disposed in the trenches of the substrate and between the fins, wherein the upper portion of the fin is higher than a top surface of the insulator and the upper portion has a substantially vertical profile, while the lower portion of the fin is lower than the top surface of the insulator and the lower portion has a tapered profile, and the substantially vertical profile of the upper portion changes into the tapered profile of the lower portion with a slope change once;

at least one gate stack, disposed over the fins and on the insulators; and strained material portions, disposed on two opposite sides of the at least one gate stack.

2. The transistor of claim 1, wherein a fin width of the upper portion at a top point is substantially equivalent to a fin width of the fin at a separating point of the upper and lower portions, and a fin width of the lower portion at a bottom point is larger than the fin width of the fin at the separating point of the upper and lower portions.

3. The transistor of claim 1, wherein a fin width of the upper portion at a top point is substantially equivalent to a fin width of the fin at a separating point of the upper and lower portions, and a fin width of the lower portion at a bottom point is about two times of the fin width of the fin at the separating point of the upper and lower portions.

4. The transistor of claim 1, wherein a spacing between the fins is substantially equal.

5. The transistor of claim 1, wherein a material of the strained material portions comprise silicon germanium (SiGe), silicon carbon (SiC) or silicon phosphide (SiP).

6. The transistor of claim 1, wherein the at least one gate stack comprises:

a gate dielectric layer covering portions of the fins and disposed on the insulators;

a gate electrode layer disposed on the gate dielectric layer; and spacers disposed on sidewalls of the gate dielectric layer and the gate electrode layer.

7. A fin-type field effect transistor, comprising:

a substrate having trenches and fins between the trenches;

insulators, disposed in the trenches of the substrate and between the fins, wherein lower portions of the fins lower than the top surfaces of the insulators are sandwiched between the insulators and the lower portions have tapered profiles;

at least one first dummy fin located further away from the fins and at least one second dummy fin located nearer to the fins, wherein a height of the at least one second dummy fin is about 1.5 times to 4 times of a height of the at least one first dummy fin, and a height of the fins is about 20 times of the height of the at least one first dummy fin;

at least one gate stack, disposed over the fins and on the insulators, wherein upper portions of the fins higher than the top surfaces of the insulators are covered by the at least one gate stack, and the upper portions have substantially vertical profiles, and the substantially vertical profile of the upper portion changes into the tapered profile of the lower portion with a slope change once; and strained material portions, disposed on two opposite sides of the at least one gate stack.

8. The transistor of claim 7, wherein a fin width of the upper portion at a top point is substantially equivalent to a fin width of the fin at a separating point of the upper and lower portions, and a fin width of the lower portion at a bottom point is about two times of the fin width of the fin at the separating point of the upper and lower portions.

9. The transistor of claim 7, wherein a spacing between the fins is substantially equal.

10. A fin-type field effect transistor, comprising:

a substrate having trenches and fins, dummy fins and additional dummy fins located between the trenches, wherein the dummy fins are located at outer sides of the fins, a height of the fins is about 5 times to 13.3 times of a height of the dummy fins, the additional dummy fins are located further away from the dummy fins and the additional dummy fins are shorter than the dummy fins, and the fin comprises an upper portion having a substantially vertical profile and a lower portion having a tapered profile, and wherein the substantially vertical profile of the upper portion changes into the tapered profile of the lower portion with a slope change once;

insulators, disposed in the trenches and between the fins and covering the dummy fins, wherein the upper portion of the fin is higher than a top surface of the insulator and the lower portion of the fin is lower than the top surface of the insulator;

at least one gate stack, disposed over the fins and on the insulators; and strained material portions, disposed on two opposite sides of the at least one gate stack.

11. The transistor of claim 10, wherein a fin width of the upper portion at a top point is substantially equivalent to a fin width of the fin at a separating point of the upper and lower portions, and a fin width of the lower portion at a bottom point is larger than the fin width of the fin at the separating point of the upper and lower portions.

12. The transistor of claim 10, wherein a fin width of the upper portion at a top point is substantially equivalent to a fin width of the fin at a separating point of the upper and lower portions, and a fin width of the lower portion at a bottom point is about two times of the fin width of the fin at the separating point of the upper and lower portions.

13. The transistor of claim 10, wherein the fins are uniform with a substantially equal critical dimension and a substantially equal spacing between the fins.

14. The transistor of claim 10, wherein a height of the fins is about 20 times of a height of the additional dummy fins.

* * * * *